(12) United States Patent
Saita et al.

(10) Patent No.: US 8,847,356 B2
(45) Date of Patent: Sep. 30, 2014

(54) COMPONENT-BUILT-IN WIRING BOARD

(75) Inventors: Kenichi Saita, Komaki (JP); Shinya Miyamoto, Kohnan (JP); Daisuke Yamashita, Komaki (JP); Shinya Suzuki, Kasugai (JP); Hirohito Hashimoto, Komaki (JP)

(73) Assignee: NGK Spark Plug Co., Ltd., Nagoya (JP)

( * ) Notice: Subject to any disclaimer, the term of this patent is extended or adjusted under 35 U.S.C. 154(b) by 0 days.

(21) Appl. No.: 13/884,340

(22) PCT Filed: Dec. 7, 2011

(86) PCT No.: PCT/JP2011/006841
§ 371 (c)(1),
(2), (4) Date: May 9, 2013

(87) PCT Pub. No.: WO2012/098616
PCT Pub. Date: Jul. 26, 2012

(65) Prior Publication Data
US 2013/0285204 A1 Oct. 31, 2013

(30) Foreign Application Priority Data

Jan. 18, 2011 (JP) ................................. 2011-008292

(51) Int. Cl.
*H01L 21/02* (2006.01)
*H05K 3/46* (2006.01)
*H05K 1/18* (2006.01)
*H01L 49/02* (2006.01)
*H05K 1/02* (2006.01)

(52) U.S. Cl.
CPC .............. *H01L 28/40* (2013.01); *H05K 3/4602* (2013.01); *H05K 1/186* (2013.01); *H05K 1/0271* (2013.01); *H05K 2201/09154* (2013.01); *H05K 2201/10015* (2013.01); *H01L 2224/16225* (2013.01)
USPC .................... 257/532; 257/700; 257/E23.144

(58) Field of Classification Search
USPC .................................. 257/532, 700, E23.144
See application file for complete search history.

(56) References Cited

U.S. PATENT DOCUMENTS

2006/0175083 A1    8/2006  Muramatsu et al.
2006/0272853 A1*  12/2006  Muramatsu et al. .......... 174/262
2008/0223607 A1    9/2008  Muramatsu et al.

FOREIGN PATENT DOCUMENTS

JP    2002-124749 A    4/2002
JP    2006-253668 A    9/2006
JP       2008060283  *  3/2008

OTHER PUBLICATIONS

JPO/ISA, International Search Report issued in corresponding international application PCT/JP2011/006841, completed Dec. 20, 2011.
Ginoshi no Tomo Henshubu, Gino Books (17)/Kikai Yoso no Handbook, 1st edition, The Publishing Taiga Shuppan Co., Ltd., May 20, 1977, p. 157, left column, lines 11-21. (Translation of cited portion provided.)

* cited by examiner

*Primary Examiner* — Timor Karimy
(74) *Attorney, Agent, or Firm* — Stites & Harbison, PLLC; Jeffrey A. Haeberlin; James R. Hayne

(57) ABSTRACT

Embodiments of the present invention provide a component-built-in wiring board capable of preventing a defect, such as a crack, resulting from stress concentration at a corner, when a component is accommodated in a housing portion of a core material with resin filler filled therebetween. The component-built-in wiring board can include a component accommodated in the housing portion of a core material, and a laminate portion in which insulating layers and conductor layers are laminated alternately on the core material. A gap between the housing portion of the core material and the component can be filled with a resin filler. In an inner circumferential portion of the housing portion of the core material a first straight chamfered portion is formed at each corner of a rectangle, and in an outer circumferential portion of the component a second straight chamfered portion is formed at each corner of a rectangle.

7 Claims, 11 Drawing Sheets

(A)

(B)

COMPONENT-BUILT-IN WIRING BOARD

CROSS REFERENCE TO RELATED APPLICATIONS

The present application is a National Stage application of PCT/JP2011/006841, filed Dec. 7, 2011, which claims priority to Japanese Patent Application No. 2011-008292, filed Jan. 18, 2011, the disclosures of which are herein incorporated by reference in their entirety.

BACKGROUND OF THE INVENTION

1. Field of the Invention

The present invention relates to a component-built-in wiring board in which a component is accommodated in an open-ended housing portion of a core material.

2. Description of Related Art

Conventionally, a package for mounting a semiconductor element, such as LSI, has been widely employed. A typical package structure has been known as a wiring board having a laminated portion in which conductor layers and insulating layers are alternately laminated on upper and lower surfaces of a core material. Such a wiring board serves as an intermediate substrate which electrically connects an external board with a semiconductor element. In recent years, a component-built-in wiring board has been disclosed in which a component is accommodated in a housing portion of the wiring board. For example, when a via array type capacitor is accommodated in the housing portion that extends through the wiring board and when a power-supply voltage supplied to a semiconductor element is connected to the capacitor, a wiring distance between the capacitor and the semiconductor element can be reduced. Further, stabilization of the power-supply voltage and the effect of noise reduction can be enhanced.

Normally, when manufacturing a component-built-in wiring board, an opening extending through a core material is formed so as to serve as a housing portion for accommodating a capacitor therein. The capacitor is fixed in the housing portion by filling a gap between an inner circumferential portion of the housing portion and an outer circumferential portion of a component with resin filler. In the manufacturing process of the component-built-in wiring board, when a variation in temperature which originates from, for example, a soldering joint or the like arises, stress resulting from difference in the coefficient of thermal expansion between the core material and the capacitor occurs. When the core material and the capacitor are relatively deformed by such stress, the resin filler disposed therebetween can absorb such deformation. Normally, since the housing portion of the core material and the capacitor both assume a rectangular shape in a plane view, the stress tends to be concentrated at near the respective corners formed by each side of the housing portion and that of the capacitor intersecting at 90 degrees, compared to the stress generated around a straight portion of each side. Such local stress concentration potentially causes a crack or air bubbles in a portion of the resin filler. Therefore, a technique has been conventionally disclosed in which corners of the housing portion of the core material and those of the capacitor both of which assume a plane shape are chamfered in order to avoid stress concentration (Patent Documents 1 and 2).

3 Related Art Documents

Patent Document 1 is Japanese Patent Application Laid-Open (kokai) No. 2006-253668.

Patent Document 2 is Japanese Patent Application Laid-Open (kokai) No. 2002-124749.

BRIEF SUMMARY OF THE INVENTION

However, according to the conventional technique, even if each corner of the housing portion of the core material and each corner of the rectangular capacitor is, for example, rounded in an arc-like form, the degree of stress concentration is reduced only a little and is insufficient for preventing a defect which originates from the stress at a corner. In this case, a radius of curvature of a rounded portion of each corner is increased so as to disperse the stress concentration. As a result, any defect can be reduced to some extent. However, in this case, a problem of reduction in capacitance value of the capacitor might occur due to excessive chamfering of the corners of the capacitor. As mentioned above, even though a component-built-in wiring board is obtained using the above conventional technique, it is difficult to fully reduce the influence of the stress concentration at a corner of resin filler while maintaining the properties of the built-in component. Thus, a crack or the like resulting from stress concentration was unlikely to be prevented. As a result, there has been a problem that high reliability and good yield of the component-built-in wiring board are impaired.

The present invention has been conceived to solve the above-mentioned conventional problem, and an object of the invention is to provide a reliable component-built-in wiring board capable of repressing any influence of stress concentration at a corner of a gap in which a resin filler is filled when a component is accommodated in a housing portion that is opened in a core material, and capable of preventing a defect, such as a crack.

In order to achieve the above object, the present invention provides a component-built-in wiring board comprising: a core material having a housing portion extending through upper and lower surfaces of the core material; a component accommodated in the housing portion; and a laminate portion in which insulating layers and conductor layers are alternately laminated on at least one of the upper and lower surfaces of the core material, wherein a gap between an inner circumferential portion of the housing portion and an outer circumferential portion of the component is filled with a resin filler, the inner circumferential portion of the housing portion has a cross-section where a first straight chamfered portion is formed at each corner of a rectangle in a plane direction, the outer circumferential portion of the component has a cross-section where a second straight chamfered portion is formed at each corner of a rectangle in the plane direction, and at least the second chamfered portion has a chamfer length greater than a width of the gap between the first chamfered portion and the second chamfered portion.

The component-built-in wiring board according to the present invention is configured such that the housing portion is formed in the core material, the component, such as a capacitor, is accommodated in the housing portion, and the laminate portion is formed on the core material while the resin filler is filled in the gap between the core material and the component. Around the corner of the gap, the first straight chamfered portion is formed in the inner circumferential portion of the housing portion of the core material, and the second straight chamfered portion is formed in the outer circumferential portion of the component. A dimensional condition of the corner satisfies the following relationship: W<L2, where "W" represents the width of the gap between the first and second chamfered portions, and where "L2" represents the chamfer length of the second chamfered portion. Therefore, around the corner of the gap, stress concentrate portions in the resin filler are separated into two locations at both ends of the first and second chamfered portions.

In this case, since the sufficient chamfer length L2 is maintained according to the dimensional condition, the stress concentrate portions can be away from each other which minimize the influence of stress concentration. In this way, generation of a crack and air bubbles resulting from stress concentration can be prevented. As a result, high quality of the component-built-in wiring board can be achievable.

In addition to the above dimensional condition, around the corner of the gap, another dimensional condition may be further established: W<L1, where "W" is the width of the gap, and where "L1" is a chamfer length of the first chamfered portion. That is, the dimensional conditions of W<L1 and W<L2 are simultaneously fulfilled, the stress concentrate portion in the resin filler is assuredly separated into two locations. The chamfer length L2 of the second chamfered portion is preferably within a range of 0.5 to 2 mm. When the chamfer length L2 is shorter than 0.5 mm, the distance between the stress concentrate portions is likely to be insufficient, resulting in insufficient effect of reducing the stress concentration. When the chamfer length L2 is larger than 2 mm, the area of the second chamfered portion increases, thereby limiting an area for the component.

In addition to the second chamfered portion, the component may have a plane shape where an arc-like rounded portion is formed at each end of a straight portion of the second chamfered portion. In this way, since the arc-like rounded portion without having an acute angle is formed at each intersection of the straight portion of the second chamfered portion and each side of the component, the degree of the stress concentration is further reduced. In this case, a radius of curvature of the rounded portion formed in the second chamfered portion is preferably lower than or equal to the chamfer length of the second chamfered portion.

A straight portion of the first chamfered portion and the straight portion of the second chamfered portion may be straight lines each of which forms an angle of about 45 degrees with neighboring sides of the respective rectangles. When fulfilling this condition, the angles formed by the first chamfered portion and each side of the housing portion of the core material, and the angle formed by the second chamfered portion and each side of the capacitor are generally 135 degrees when viewed from the inner circumference side. This angle decreases as the angle formed by the straight portion and its neighboring side deviates from 45 degrees. Thus, it is advantageous that the dimensional condition of the greatest obtuse angle of 135 degree is satisfied in order to reduce the stress concentration.

In the component-built-in wiring board of the present invention, various components can be employed. Particularly, the present invention is applicable to a capacitor built-in substrate on which a capacitor is mounted as a component. For example, as a capacitor, a multilayer ceramic capacitor in which ceramic dielectric layers and internal electrode layers are alternately laminated and a plurality of via conductors connected to the internal electrode layers is arranged in a form of lattice or a hound's-tooth check may be employed.

According to the present invention, in the gap between the housing portion of the core material and the component, the chamfered portion is formed at each corner of the respective rectangles in order to fulfill the predetermined dimensional conditions in the component-built-in wiring board. In this way, the stress concentration in the resin filler can be separated into two locations. Thus, any defect, such as a crack, can be effectively prevented by reducing the local stress concentration, compared to the conventional case where the stress is concentrated on a single location at each corner. Therefore, high quality and the high yield can be maintained without excessively applying the load during the manufacturing process of the component built-in wiring board.

DETAILED DESCRIPTION OF EXEMPLARY EMBODIMENTS OF THE INVENTION

A preferred embodiment of the present invention will next be described with reference to the drawings. However, the embodiment to be described below is a mere example of application of the technical concept of the present invention. The contents of the embodiment should not be construed as limiting the invention.

Figure 1:
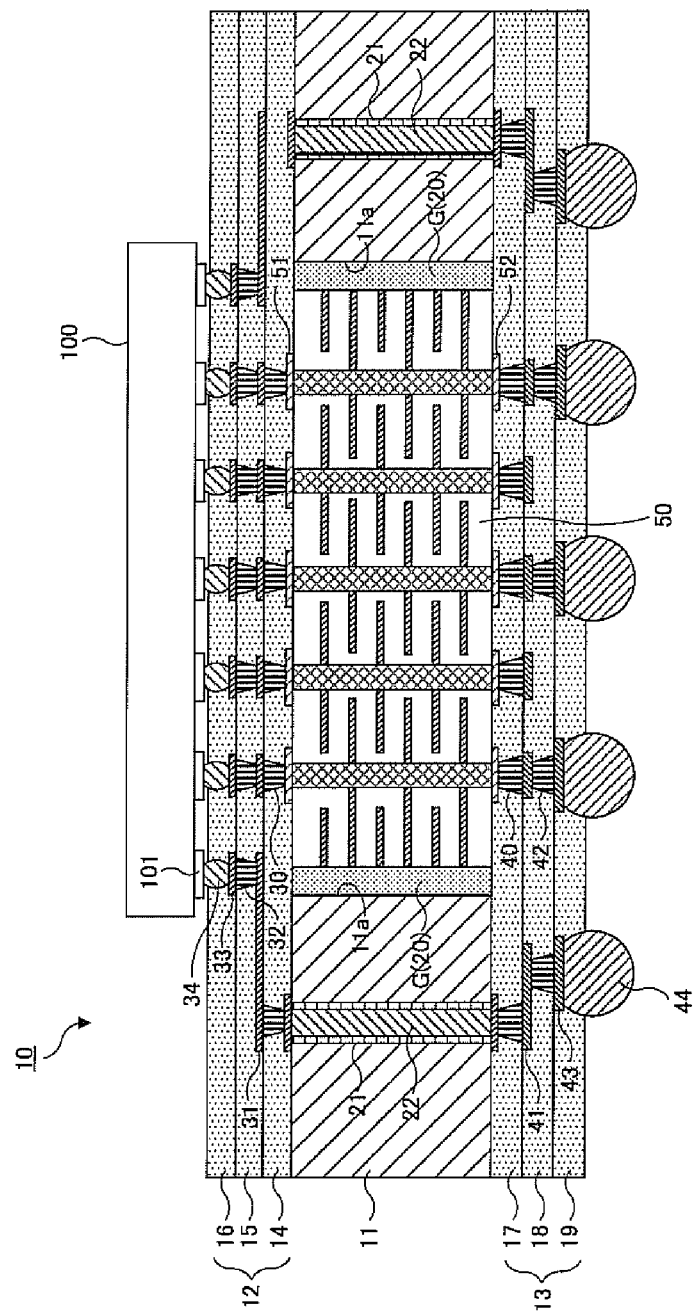
FIG. 1 is a sectional view schematically showing the structure of a wiring substrate of an embodiment of the present invention.

First, the structure of a component-built-in wiring board according to an embodiment of the present invention will be described. FIG. 1 schematically shows a cross-sectional view of the structure of a wiring substrate 10 having a built-in component (hereinafter, called merely "the wiring board 10") of the present embodiment. As shown in FIG. 1, the wiring board 10 of the present embodiment includes a core material 11 formed from, for example, an epoxy resin which contains glass fiber, a first build-up layer 12 (laminate portion) on a side toward the upper surface of the core material 11, and a second build-up layer 13 (laminate portion) on a side toward the lower surface of the core material 11. The wiring board 10 has a capacitor 50, which is a component-built-in therein, and a semiconductor chip 100, which is a semiconductor element, mounted thereon.

The core material 11 includes a housing portion 11a extending therethrough in a central region thereof and assuming a rectangular shape as viewed in plane. The capacitor 50 is accommodated in the housing portion 11a in an embedded condition. Although it is not particularly limited, the plate-like core material 11 assumes, for example, a square shape with about 25 mm in length in a plane direction and about 0.9 mm in thickness. A plurality of through-hole conductors 21 extending through the core material 11 in a laminate direction are formed in an outer circumferential region of the core material 11. An upper end and a lower end of the through-hole conductor 21 are electrically connected to via conductors 30 and 40, which will be described later, through conductor layers of the upper and lower surfaces of the core material 11, respectively.

The capacitor 50 is a via-array-type multilayered ceramic capacitor which forms a predetermined capacity between a positive electrode and a negative electrode. The capacitor 50 is electrically connected to conductor layers 31 of the first buildup layer 12 and conductor layers 41 of the second buildup layer 13 through an upper surface electrode layer 51 and a lower surface electrode layer 52 formed at respective opposite surfaces of the capacitor 50. Although it is not particularly limited, the plate-like capacitor 50 assumes, for example, a square shape with a side length of about 12 mm in a plane direction and a thickness of about 0.9 mm.

Figure 2:
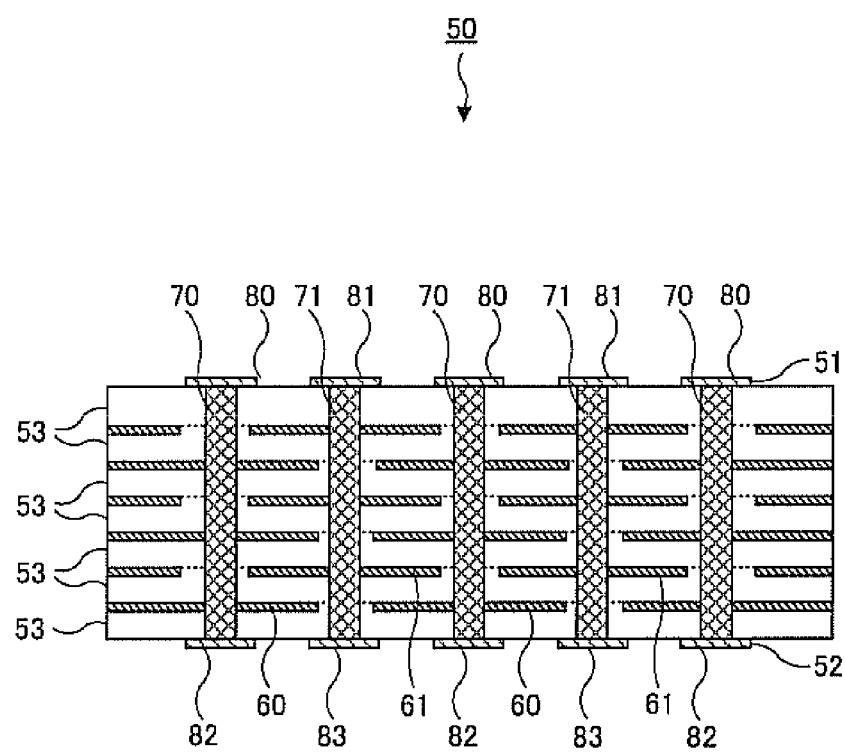
FIG. 2 is a sectioned structural view of a capacitor 50.
Figure 3:
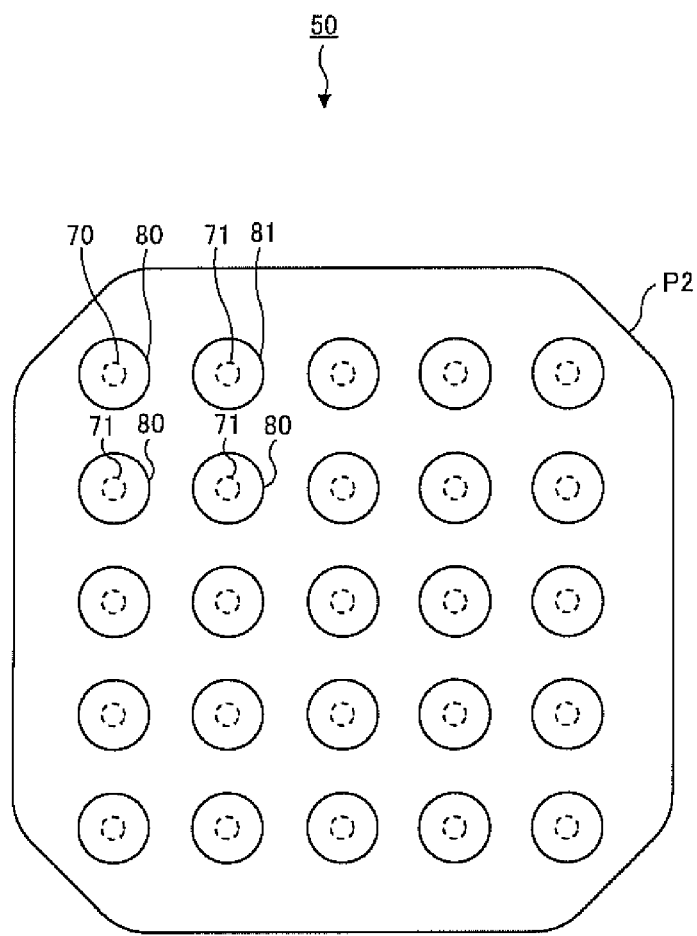
FIG. 3 is a plane structural view of an upper surface electrode layer 51 of the capacitor 50.

The structure of the capacitor 50 will be described with reference to FIGS. 2 and 3. FIG. 2 is a cross-sectional structure of the capacitor 50, and FIG. 3 is a plane structure of the upper surface electrode layer 51 of the capacitor 50. The capacitor 50 of the present embodiment is formed of a ceramic sintered body made of high-permittivity ceramic, such as barium titanate. The capacitor 50 has a structure in which a plurality of ceramic dielectric layers 53 are laminated. As shown in FIG. 2, an internal electrode layer 60 and an internal electrode layer 61 both of which contains nickel as a main component are alternately formed between the ceramic dielectric layers 53. The internal electrode layer 60 functions as a negative electrode, and the internal electrode layer 61 functions as a positive electrode. The internal electrode layer 60 and the internal electrode layer 61 face each other by sandwiching the ceramic dielectric layer 53 therebetween so as to form a predetermined capacity.

A plurality of via conductors 70 and 71 are formed in the capacitor 50. The via conductors 70, 71 are formed such that a plurality of via holes which penetrate all the ceramic dielectric layers 53 in the laminate direction are filled with nickel or the like. While the via conductor 70 for the negative electrode is connected to the internal electrode layer 60, the via conductor 71 for the positive electrode is connected to the internal electrode layer 61. A plurality of terminal electrodes 80 for the negative electrode and a plurality of terminal electrodes 81 for the positive electrode are formed on the surface electrode layer 51 of the capacitor 50. A plurality of terminal electrodes 82 for the negative electrode and a plurality of terminal electrodes 83 for the positive electrode are formed on the lower surface electrode layer 52 of the capacitor 50. Therefore, the plurality of via conductors 70 are electrically connected to the terminal electrodes 80 at the upper side and the terminal electrodes 82 are electronically connected at the lower side. The plurality of via conductors 71 are electrically connected to the terminal electrodes 81 at the upper side, and the terminal electrodes 83 are electronically connected at the lower side.

As shown in FIG. 3, on the upper surface electrode layer 51, the terminal electrodes 80 for the negative electrode and the terminal electrode 81 for the positive electrode are arranged in a lattice pattern. The via conductor 70 for the negative electrodes and the via conductor 71 for the spositive electrode are also arranged in a lattice pattern. Further, the terminal electrode 82 for the negative electrodes and the terminal electrode 83 for the positive electrodes are arranged the same on the lower electrode layer 52. Although the terminal electrodes 80 and 81 are arranged in the lattice pattern in FIG. 3, they may be arranged in a hound's-tooth pattern. Normally, a conductor pattern is formed on a portion in which no terminal electrode 80, 81 exist so that one of the terminal electrodes 80, 81 is electrically connected to the conductor pattern. However, such illustration is omitted in FIG. 3. As shown in FIG. 3, in the outer circumference of the capacitor 50, a chamfered portion P2 is formed at each corner of the rectangle. The function of this chamfered portion P2 will be described later.

Returning to FIG. 1, a gap G between the capacitor 50 and the inner circumferential portion of the housing portion 11a of the core material 11 is filled with a resin filler 20. The resin filler 20 is formed from a polymeric material, such as thermosetting resin, so as to fix the capacitor 50 in the core material 11. More particularly, the resin filler 20 functions to absorb deformation stemming from difference in the coefficient of thermal expansion between the core material 11 and the capacitor 50 through elastic deformation of the resin filler 20.

In this embodiment, as described, in addition to each corner of the capacitor 50 in the plane direction, the housing portion 11a of the core material 11 in the plane direction also adopts a structure where each corner thereof is chamfered in a predetermined form so as to prevent a defect caused by local stress concentration in the resin filler 20.

The first build-up layer 12 is a lamination of a resin insulation layer 14 disposed above the core material 11, a resin insulation layer 15 disposed above the resin insulation layer 14, and a solder resist layer 16 disposed above the resin insulation layer 15. A conductor layer 31 is formed on the upper surface of the resin insulation layer 14. A plurality of terminal pads 33 are formed on the upper surface of the resin insulation layer 15. The resin insulation layer 14 has a plurality of via conductors 30 in predetermined locations thereof and adapted to establish electrical connection in the laminate direction between the conductor layer 31 and upper-end electrodes of the through-hole conductors 21 and the upper surface electrode layer 51 of the capacitor 50. Also, the resin insulation layer 15 has a plurality of via conductors 32 in predetermined locations thereof and adapted to establish electrical connection in the laminate direction between the conductor layer 31 and the terminal pads 33. The solder resist layer 16 has a plurality of openings where the plurality of the terminal pads 33 are exposed respectively. A plurality of solder bumps 34 are formed on the exposed terminal pads 33, respectively. Each solder bump 50 is connected to a respective pad 101 of the semiconductor chip 100 mounted on the wiring substrate 10.

The second build-up layer 13 is a lamination of a resin insulation layer 17 disposed under the core substrate 11, a resin insulation layer 18 disposed under the resin insulation layer 17, and a solder resist layer 19 disposed under the resin insulation layer 18. A conductor layer 41 is formed on the lower surface of the resin insulation layer 17. A plurality of BGA pads 43 are formed on the lower surface of the resin insulation layer 18. The resin insulation layer 17 has a plurality of via conductors 40 in predetermined locations thereof and adapted to establish electrical connection in the laminate direction between the conductor layer 41 and lower-end electrodes of the through-hole conductors 21 and the lower surface electrode layer 52 of the capacitor 50. Also, the resin insulation layer 18 has a plurality of via conductors 42 in predetermined locations thereof and adapted to establish electrical connection in the laminate direction between the conductor layer 41 and the BGA pads 43. The solder resist layer 19 has a plurality of openings where a plurality of the BGA pads 43 are exposed respectively. A plurality of solder balls 44 are formed on the exposed BGA pads 43, respectively. These solder balls 44 can be electrically connected to an external board (not shown).

For example, in the supply voltage and ground potential which are supplied to the semiconductor chip 100 in the cross-sectional structure of FIG. 1, the supply voltage is connected to the positive electrode of the capacitor 50 and the ground potential is connected to the negative electrode of the capacitor 50. Therefore, on the upper side of the capacitor 50, the pads 101 for the ground potential of the semiconductor chip 100 and the terminal electrodes 80, and the pads 101 for the supply voltage of the semiconductor chip 100 and the terminal electrodes 81 are electrically connected, respectively, through the solder bumps 34, the terminal pads 33, the via conductors 32, the conductor layer 31, and the via conductors 30 in FIG. 1. Similarly, in the lower side of the capacitor 50, the terminal electrodes 82 and the terminals for the ground potential of an external board, and the terminal electrodes 83 and the terminals for the supply voltage of an external board are electrically connected, respectively, through the via conductors 40, the conductor layer 41, the via conductors 42, the BGA pads 43, and the solder balls 44 of FIG. 1.

Next, in the wiring board 10 of the present invention, a structure for reducing the stress concentration on a portion of the resin filler 20 will be described. A feature of the present invention can be represented with a planar cross-sectional structure in an arbitral plane view (hereinafter simply referred to as a "plane structure") including the core material 11 and the capacitor 50 in the wiring board 10 of FIG. 1. Hereafter, specific features of the plane structure according to the present invention will be described for the following two embodiments.

First Embodiment

Figure 4:
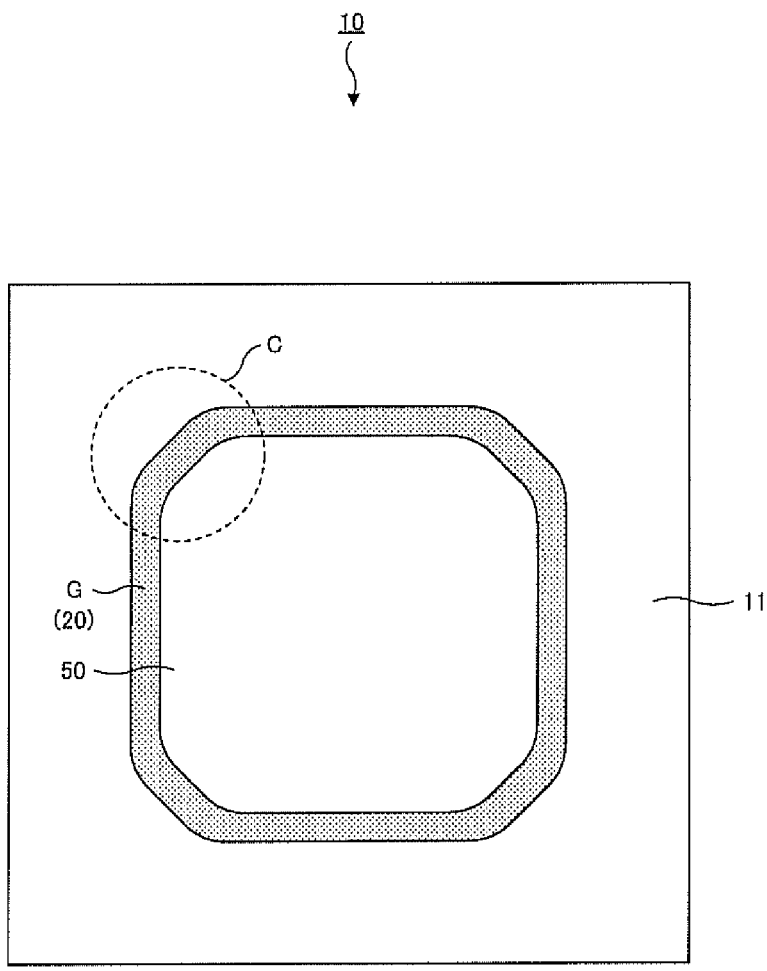
FIG. 4 is a plane view schematically showing the plane structure of a first embodiment of the present invention.

FIG. 4 is a plane view schematically showing a first embodiment regarding the plane structure of the present invention. For the purpose of simplification, the through hole conductors 21 of the core material 11, the plugging bodies 22 or the via conductors 70, 71 of the capacitor 50 are omitted in the drawing. FIG. 4 only shows the core material 11 on the outer circumference side, the capacitor 50 on the inner circumference side, and the resin filler 20 between the core material 11 and the capacitor 50.

An outer circumferential portion of the core material 11 assumes a rectangular form, and the inner circumferential portion of the housing portion 11a has a plane shape in which each corner of the rectangle is chamfered. The capacitor 50 includes the outer circumferential portion having a plane shape in which each corner of the rectangle is chamfered. Therefore, the gap G filled with the resin filler 20 has a ring-like plane shape defined by the plane shape of the chamfered housing portion 11a and the plane shape of the chamfered capacitor 50. In FIG. 4, a corner area C includes a single corner of the housing portion 11a serving as the inner circumferential portion of the core material 11, a single corner of the capacitor 50 and a part of the resin filler 20 sandwiched therebetween. That is, four corner areas C arranged in a symmetrical form with the identical structure exist in the plane view shown in FIG. 4.

Figure 5:
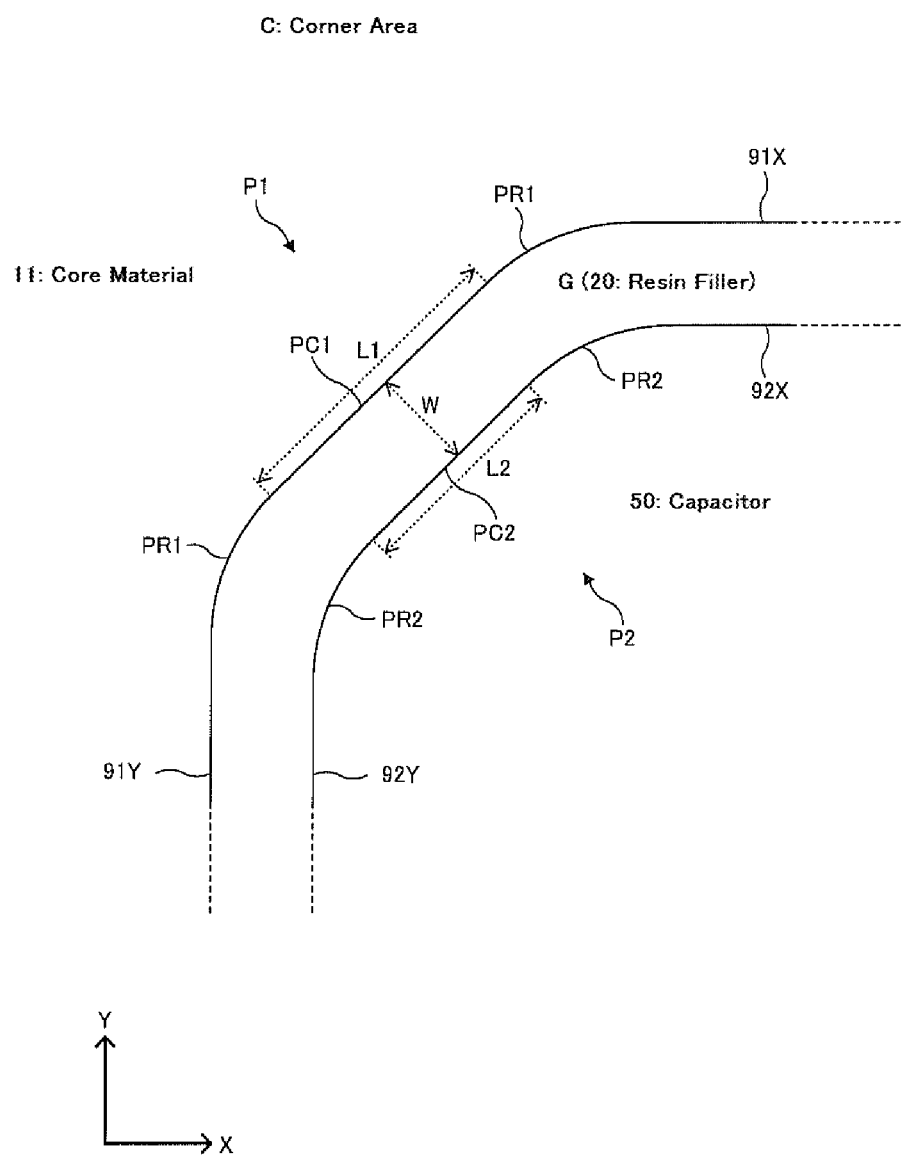
FIG. 5 is an explanatory enlarged view showing one of corner areas C in the plane view of FIG. 4.

FIG. 5 is an explanatory enlarged view showing one of the corner areas C in the plane view of FIG. 4. For convenience, an X direction and a Y direction are indicated in the lower part of FIG. 5 with arrows, respectively. In the corner area C of FIG. 5, a chamfered portion P1 at the corner of two sides 91 (a side 91X in the X direction and a side 91Y in the Y direction) of the housing portion 11a of the core material 11, a chamfered portion P2 at the corner of two sides 92 (a side 92X in the X direction and a side 92Y in the Y direction) of the capacitor 50, and an area sandwiched between the chamfered portions P1, P2 in the gap G that is filled with the resin filler 20 are shown.

First, the chamfered portion P1 of the core material 11 is divided into a straight chamfered portion PC1 formed at an angle of generally 45 degrees with each side 91X, 91Y and two arc-like rounded potions PR1 formed at both ends of the chamfered portion PC1. The chamfered portion PC1 has a chamfer length L1 at its straight portion, and each arc-like rounded potion PR1 has a predetermined radius of curvature R1 (not illustrated). On the other hand, the chamfered portion P2 of the capacitor 50 is divided into a straight chamfered portion PC2 formed at an angle of generally 45 degrees with each side 92X, 92Y and two arc-like rounded potions PR2 formed at both ends of the chamfered portion PC2. The chamfered portion PC2 has a chamfer length L2 at its straight portion, and each arc-like rounded potion PR2 has a predetermined radius of curvature R2 (not illustrated). For example, each radius of curvature R1 and R2 is set to be around 0.5 mm. Although the angles formed by the chamfered portions PC1, PC2 and the sides 91, 92, respectively, are not limited to 45 degrees, at this time, the angle viewed from the inner circumference side is 135 degrees at the maximum, which is favorable in view of the stress reduction.

Further, the gap G has a width W in a portion thereof sandwiched between the chamfered portions PC1, PC2. Since the chamfered portions PC1, PC2 are arranged in parallel, the width W in this portion is constant. Although the width of the gap G in the portion between the chamfered portions PR1, PR2 or the portion between the sides 91, 92 are not particularly limited, the width W in FIG. 5 generally remains constant.

As a specific dimensional condition in the first embodiment, the chamfer length L1 on the core material 11 side is preferably within a range of 0.7 to 5 mm, and the chamfer length L2 on the capacitor 50 side is preferably within a range of 0.5 to 2 mm. In this case, it is preferable that each chamfer length L1, L2 does not exceed 40% of the length of each side 91, 92 (the shorter side in the case where the core material assumes a rectangular shape). The width W of the gap G is preferably within a range of 0.1 to 1.5 mm.

On the other hand, a relationship between each dimensional parameter (the width W of the gap G, the chamfered portions PC1, PC2 and the chamfer lengths L1, L2) in FIG. 5 satisfy the following expressions (1), (2) and (3):

$$W<L1 \tag{1}$$

$$W<L2 \tag{2}$$

$$L1>L2 \tag{3}$$

In the first embodiment, in order to obtain the effect of reducing the stress concentration of the resin filler 20, it is preferable that the relationship of W<L2 . . . (2) be satisfied. The detailed effect will be described later. Although no limitation is applied to (1) and (3), these are the examples of the dimensional restrictions in order to keep the constant width W of the gap G in the entire circumference as mentioned above and not to make the size of the capacitor 50 small more than necessary (i.e., the width W is not expanded too much).

Figure 6:
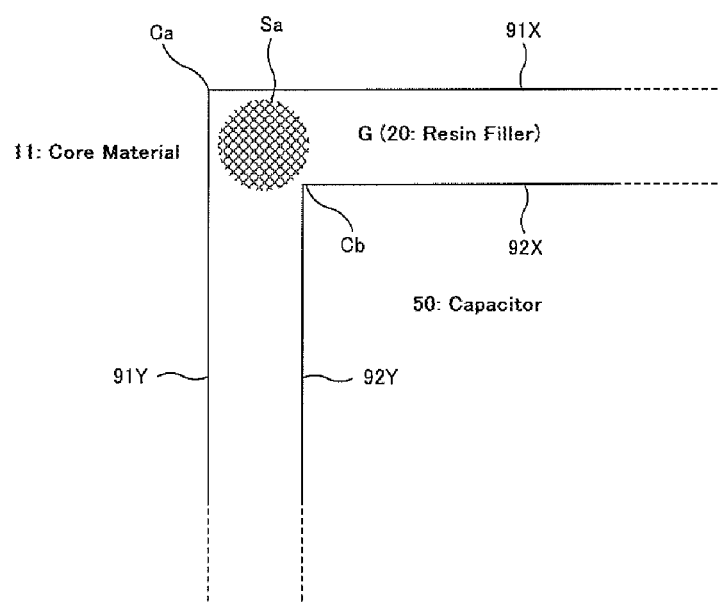
FIG. 6 is a view showing, as a comparative example for comparison with the first embodiment, two types of plane structures of conventional wiring board.
Figure 6:
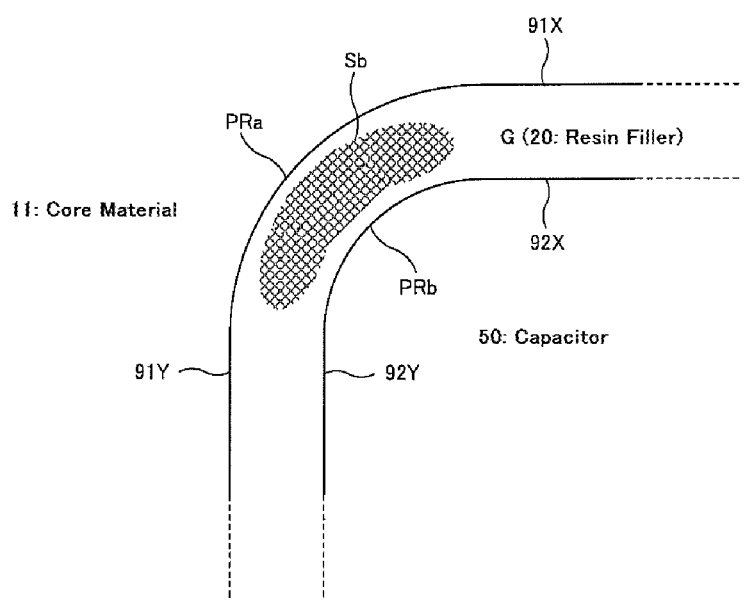
Figure 7:
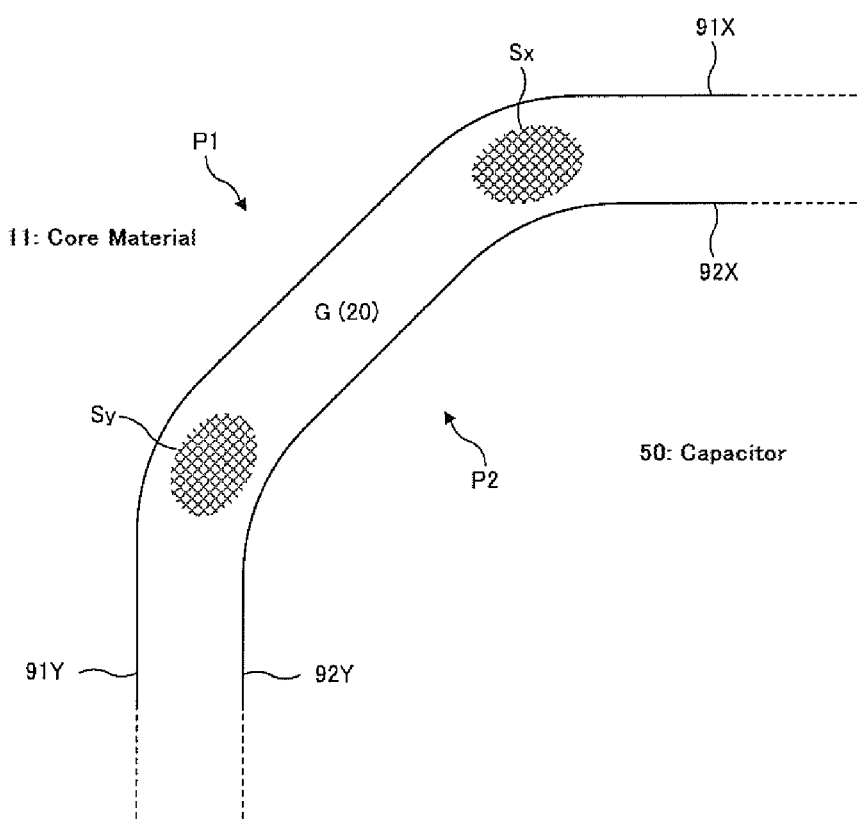
FIG. 7 is an explanatory view of the effect of the stress reduction in the case where the plane structure of the first embodiment is adopted.

With reference to FIGS. 6 and 7, the effect of adopting the plane structure of the first embodiment will be described in detail. FIG. 6 shows a view showing, as a comparative example for comparison with the first embodiment, two types of plane structures of the conventional wiring boards. FIG. 6 (A) shows a plane structure as a first comparative example where neither corner of the housing portion 11a nor of the capacitor 50 in the corner area C of FIG. 5 is chamfered but remained in the rectangular shape. FIG. 6 (B) shows a plane structure as a second comparative example where each corner of the housing portion 11a and that of the capacitor 50 are rounded at a predetermined radius of curvature in the corner area C of FIG. 5.

As shown in FIG. 6(A), no rounded portion is provided in the first comparative example. In this example, there is a corner Ca where the sides 91X and 91Y of the housing portion 11a of the core material 11 intersect perpendicularly and a corner Cb where the sides 92X and 92Y of the capacitor 50 intersect perpendicularly. A stress concentrate portion Sa in the resin filler 20 is generated around the corners Ca and Cb in the gap G. As a result, a defect, such as a crack, in the stress concentrate portion Sa is highly likely to occur after filling the gap G with the resin filler 20 during the manufacturing of the wiring board 10.

As shown in FIG. 6(B), in the second comparative example, a rounded portion PRa is formed at the corner of the housing portion 11a of the core material 11 and a rounded portion PRb is formed at the corner of the capacitor 50. Thus, in the gap G, a stress concentrate portion Sb is generated between arc portions of the rounded portions PRa, PRb in the resin filler 20. In this case, compared to the stress concentrate portion Sa in FIG. 6 (A), the stress concentrate portion Sb in FIG. 6 (B) without any corner spreads in a wider area along the arc portions, thereby reducing the influence of the stress, such as a crack, in the resin filler 20. However, in FIGS. 6 (A) and (B), it is common that the stress concentrate portions Sa and Sb are generated in a single location of the corner area C.

On the other hand, FIG. 7 is an explanatory view of the effect of the stress reduction in the case where the plane structure of the first embodiment is adopted, and it shows the same area as in FIG. 5. As shown in FIG. 7, in the corner area C of this embodiment, a stress concentrate portion Sx formed around the sides 91X and 92X in the X direction and a stress concentrate portion Sy formed around the sides 91Y and 92Y in the Y direction are generated in the gap G between the chamfered portion P1 of the core material 11 and the chamfered portion P2 of the capacitor 50. The stress concentrate portions Sx and Sy are located in both ends of a straight portion of the gap G, respectively, between the rounded portions PR1 and PR2 of FIG. 5. Thus, this embodiment differs from the comparative examples of FIGS. 6(A) and (B) in that the stress concentrate portions Sx and Sy are generated in two locations in the single corner area C.

As shown in FIG. 7, adopting the plane structure of this embodiment, the stress generated in the corner area C can be separated into two locations after the gap G is filled with the resin filler 20 during the manufacturing of the wiring board 10. Thus, a defect, such as a crack, resulting from the stress in the resin filler 20 can be assuredly prevented. However, when the distance between the stress concentrate portions Sx and Sy is short, the effect of preventing the influence of the stress is hindered. Thus, it is necessary to keep a certain distance of a straight area of the gap G between the chamfered portions PC1 and PC2. Therefore, it is important that the relationship between the width W of the gap G and the chamfer length L2 of the chamfered portion PC2 satisfy the expression (2).

Second Embodiment

Figure 8:
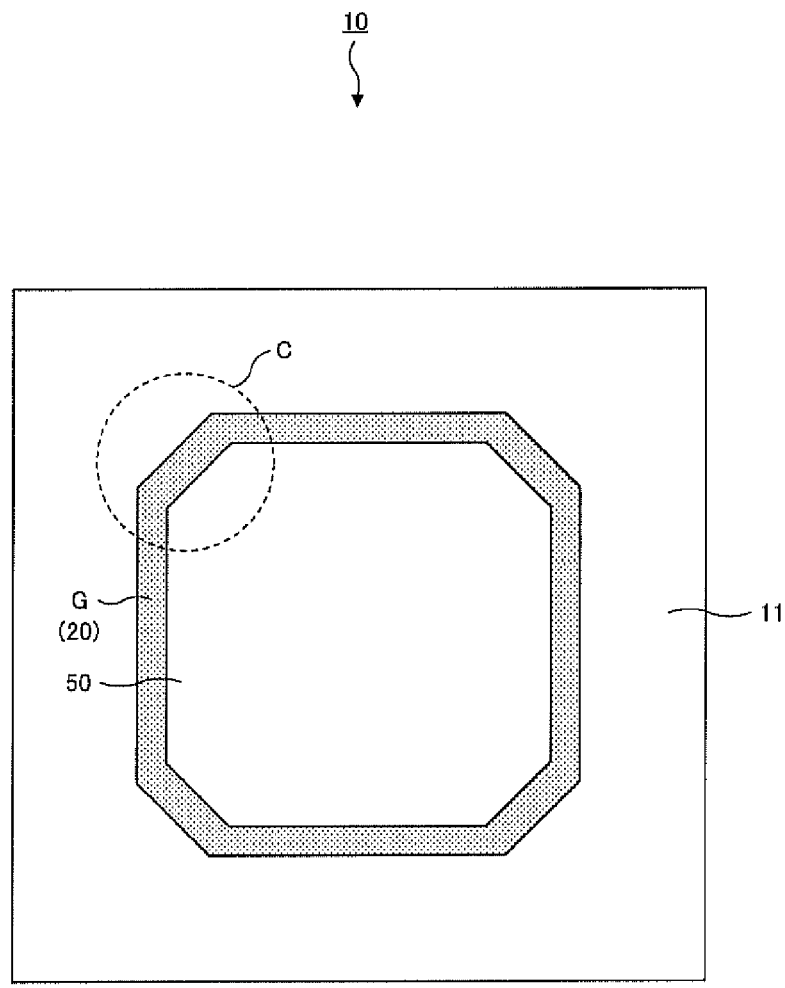
FIG. 8 is a schematic plane view showing a plane structure of a second embodiment of the present invention.

FIG. 8 is a schematic plane view showing a second embodiment regarding the plane structure of the present invention. Each member shown in FIG. 8 is the same as that in the first embodiment (FIG. 4). The differences between the plane structure of FIG. 4 and that of FIG. 8 are a chamfer shape of the housing portion 11a of the core material 11 and a chamfer shape of the capacitor 50 in the four corner areas C. Since other structures are the same as those in the first embodiment, description thereof will be omitted.

Figure 9:
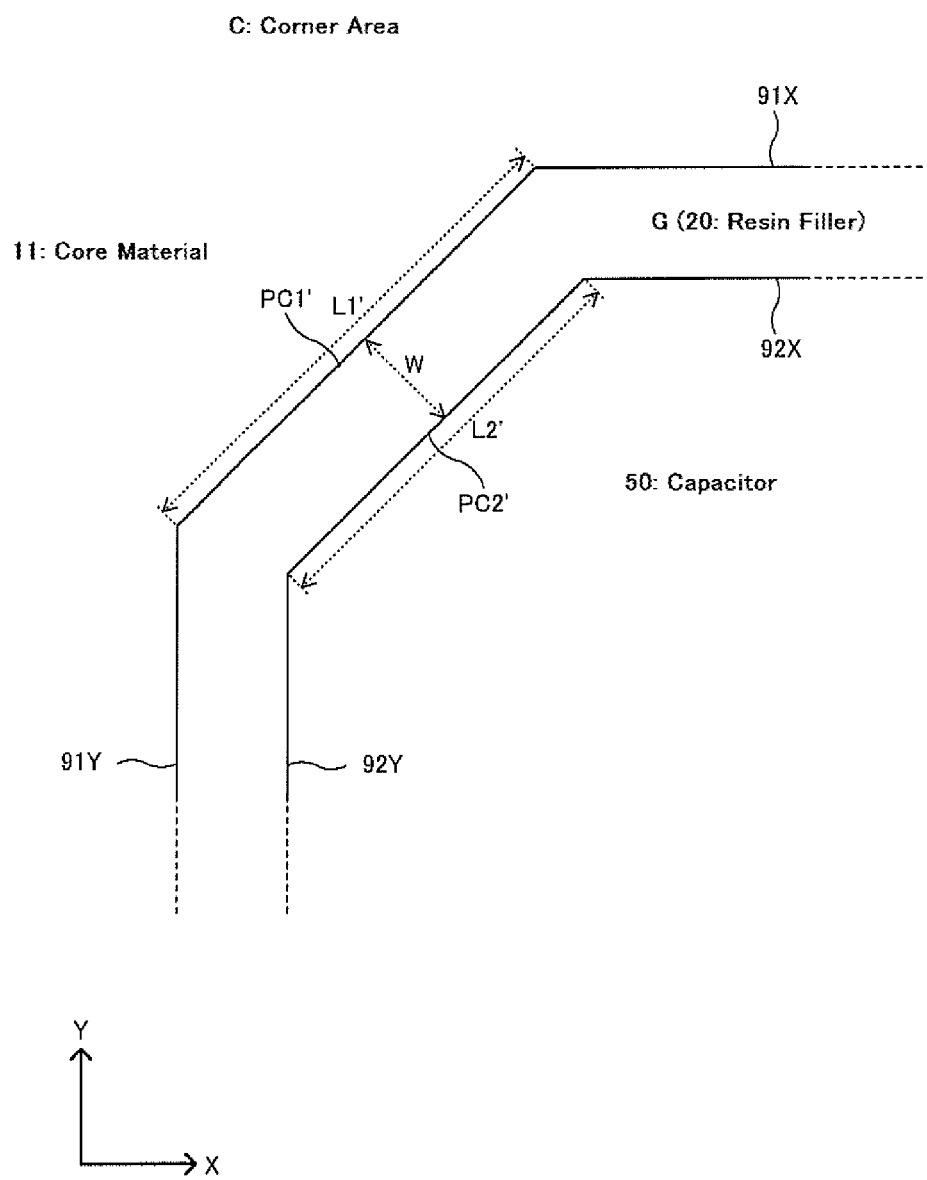
FIG. 9 is an enlarged view of a typical structure of one of the corner areas C in the plane view of FIG. 8.

FIG. 9 is an enlarged view of a detailed typical structure of one of the corner areas C in the plane view of FIG. 8, and shows the same area as in the first embodiment of FIG. 5. As shown in FIG. 9, in the corner area C, the inner circumferential portion of the housing portion 11a of the core material 11 and the outer circumferential portion of the capacitor 50 are chamfered, but no rounded portion is formed thereto, which is the difference from the structure of FIG. 5. That is, a straight chamfered portion PC1' having an angle of 45 degrees that is formed with two sides 91X and 91Y is formed on the core material 11 side, and both ends of the chamfered portion PC1' are directly connected to the sides 91X, 91Y. A straight chamfered portion PC2' having an angle of 45 degrees that is formed with two sides 92X and 92Y is formed on the capacitor 50 side, and both ends of the chamfered portion PC2' are directly connected to 92X, 92Y.

As shown in FIG. 9, a straight portion of the chamfered portion PC1' on the core material 11 side has a chamfer length L1', and a straight portion of the chamfered portion PC2' on the capacitor 50 side has a chamfer length L2'. The gap G has a constant width W between the chamfered portions PC1' and PC2'. Compared to the structure of FIG. 5, the chamfer lengths L1' and L2' of the chamfered portion PC1', PC2', respectively, are longer because no rounded portion is formed. Although the width W of the gap G in FIG. 9 is the same as that of FIG. 5, it is not particularly limited.

Similar to the expressions (1), (2) and (3) of the first embodiment, each dimensional parameter in FIG. 9 satisfies the following expressions (1)', (2)' and (3)'.

$$W < L1' \tag{1}'$$

$$W < L2' \tag{2}'$$

$$L1' > L2' \tag{3}'$$

In the second embodiment, similar to the view of the first embodiment, specifically, the expression (2)' is preferably satisfied in order to obtain the effect of reducing the stress concentration in the resin filler 20. Although no limitation is applied to the expressions (1)' and (3)', these are the examples whose dimensional limitations enable the capacitor 50 to have a necessary size by keeping the constant width W in the entire circumference of the gap G as described above (i.e., the width W is not excessively extended).

The effect of adopting the plane structure of the second embodiment is basically the same as the first embodiment described with reference to FIGS. 6 and 7. However, as shown in FIG. 7, the first embodiment and second embodiment have the stress concentrate portions Sx, Sy formed in the separate locations of the corner area C. Thus, the stress concentrate portions Sx, Sy of the second embodiment has no rounded portion, whereby a disperse range of the stress concentrate portions Sx, Sy is slightly narrower than that of the first embodiment. As a result, although the effect of reducing the stress concentration in the first embodiment is higher than that of the second embodiment, the second embodiment can sufficiently prevent influence of the stress because the stress concentrate portions Sx, Sy are separated into two locations, compared to the plane structures of FIGS. 6 (A) and (B). Further, only the chamfered portions PC1' and PC2' are formed in the corner area C, whereby the manufacturing process of the wiring board can be simplified.

Method for Manufacturing a Wiring Board

Figure 10:
FIG. 10 is a view showing a first cross-sectional structure for explaining a method for manufacturing the wiring board of the embodiment.

Next, a method for manufacturing the wiring substrate 10 of the present embodiment will be described with reference to FIGS. 10 to 13. First, as shown in FIG. 10, a substrate for the core material 11 having the housing portion 11a therein is prepared. Normally, in order to form an intermediate product for a multi-piece-array where a plurality of wiring boards 10 are produced, the prepared substrate assumes a square shape, for example, measuring 400 mm in length and 0.80 mm in thickness. In the following, a structure of one of the wiring boards will be only illustrated for the purpose of simplification. A through-hole serving as the housing portion 11a is formed by use of a router in a predetermined location of the substrate serving as the core material 11. At this time, as shown in FIG. 4 or FIG. 8, the housing portion 11a is so processed that each corner thereof has a chamfered portion in a plane view. As the substrate of the core material 11, a copper clad laminate in which copper foils are laminated on respective opposite sides of the substrate may be used.

On the other hand, the capacitor 50 is manufactured as follows. A laminate portion including the internal electrode layers 60, 61 is formed by a known technique using ceramic green sheets. Thereafter, via conductors 70, 71 and terminal electrodes 80 to 83 are formed on the thus-formed laminate portion. Then, similar to the wiring board 10, the laminate portion for a multi-piece-array where a plurality of capacitors 50 is produced is subject to a punching process to form a piece part capacitor 50 of FIG. 4 or FIG. 8. The capacitor 50 has a plane shape having a chamfered portion at each corner thereof. Subsequently, electrolytic copper plating is applied to the surface of the terminal electrodes 80 to 83 to complete the capacitor 50 through a firing process.

Figure 11:
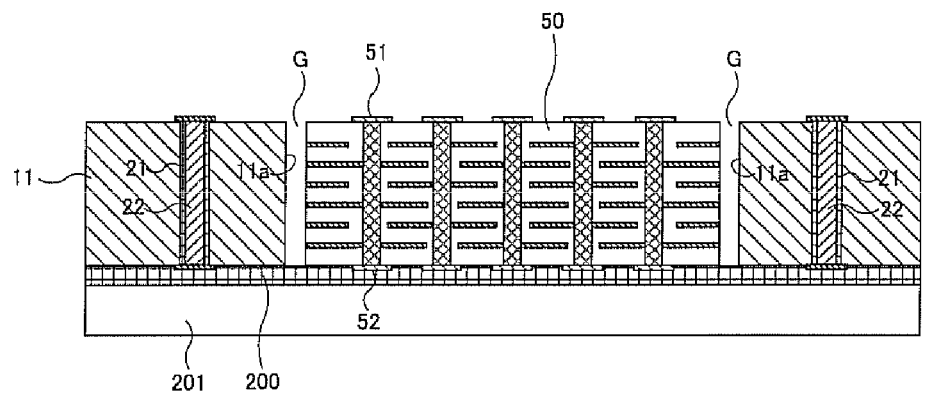
FIG. 11 is a view showing a second cross-sectional structure for explaining manufacturing the wiring board of the present invention.

As shown in FIG. 11, by use of a drilling machine, through-holes are formed in the core material 11 at positions corresponding to the through-hole conductors 21. The through-holes are subject to electroless copper plating and electrolytic copper plating, thereby forming the through-hole conductors 21. Subsequently, paste containing epoxy resin as a main component is filled, by printing, into the through-hole conductors 21, followed by setting to form the plugging bodies 22. A removable adhesive tape 200 is fixed on a bottom of the housing portion 11a. The adhesive tape 200 is supported by a support table 201. Next, by use of a mounting apparatus, the capacitor 50 is accommodated in the housing portion 11a so as to be temporarily fixed on the adhesive tape 200.

Figure 12:
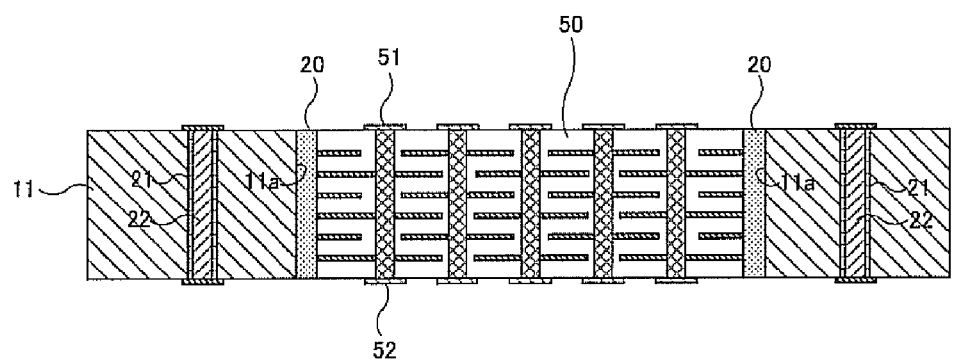
FIG. 12 is a view showing a third cross-sectional structure for explaining manufacturing the wiring board of the present invention.

Subsequently, by use of a dispenser, the resin filler 20 made of thermosetting resin is filled in the gap G between the housing portion 11a and the side face of the capacitor 50. Through curing the resin filler 20 by heat-treatment, the capacitor 50 is fixed in the housing portion 11a. Thereafter, as shown in FIG. 12, the adhesive tape 200 is removed. Then, the adhesive material remained on the lower surface of the core material 11 and on the lower surface electrode layer 52 of the capacitor 50 is subject to solvent cleaning and is removed by grinding it. Further, the surface of the copper plating layers formed on the upper surface electrode layer 51 of the capacitor is roughened.

Figure 13:
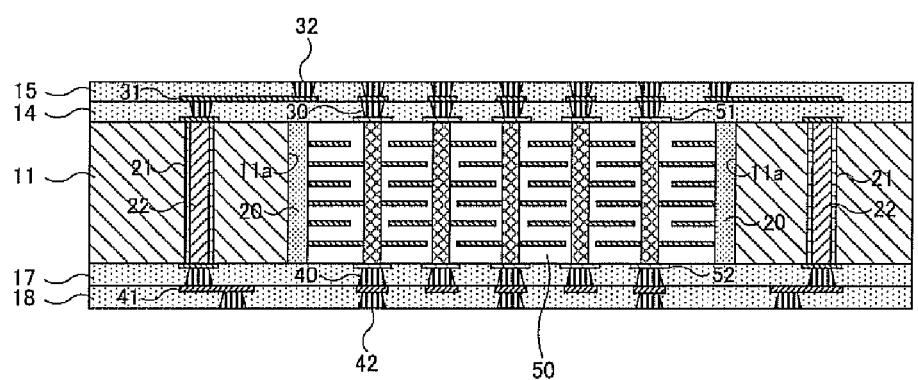
FIG. 13 is a view showing a fourth cross-sectional structure for explaining manufacturing the wiring board of the present invention.

Then, as shown in FIG. 13, a film of an insulation resin material which contains epoxy resin as a main component is laminated on each of the upper and lower surfaces of the core material 11. Then, the insulation resin material is set through application of pressure and heat under a vacuum, thereby forming the resin insulation layers 14, 17. The surfaces of the resin insulation layers 14 and 17 are subjected to laser beam machining at predetermined positions, thereby forming a plurality of via holes. Then, after a desmearing process is performed, via conductors 30 and 40 are formed in each via hole.

Subsequently, patterning is performed on the surfaces of the resin insulation layers 14 and 17, thereby forming the conductor layers 31 and 41. Next, the above-mentioned film of an insulation resin material is laminated on the upper surface of the resin insulation layers 14 and 17. Then, the insulation resin material is set through application of pressure and heat under a vacuum, thereby forming the resin insulation layers 15 and 18. A plurality of via conductors 32 and 42 are formed in the resin insulating layers 15 and 18, respectively, by a method similar to the above-mentioned method used to form the via conductors 30 and 40.

Then, referring back to FIG. 1, a plurality of the terminal pads 33 are formed on the upper surface of the resin insulation layer 15, and a plurality of the BGA pads 43 are formed on the lower surface of the resin insulation layer 18. Next, a photosensitive epoxy resin is applied to the upper surface of the resin insulation layer 15 and to the lower surface of the resin insulation layer 18, followed by curing for forming the solder resist layers 16 and 19. Subsequently, openings are formed in the solder resist layer 16 by patterning, and a plurality of the solder bumps 34 are formed in the respective openings for connection to a plurality of the terminal pads 33, respectively. Also, openings are formed in the solder resist layer 19 by patterning, and a plurality of the solder balls 44 are formed in the respective openings for connection to a plurality of the BGA pads 43, respectively. By the procedure mentioned above, the wiring substrate 10 of the present embodiment is completed.

While the present invention has been described with reference to the above embodiments, the present invention is not limited thereto, but may be modified in various other forms without departing from the gist of the invention. For example, although the present embodiment has been applied to the component-built-in wiring board, it can be applied to a component-built-in wiring board on which a component other than the capacitor is mounted, so long as the structural features of the present invention are employed. Further, the structure, the material, or any detailed manufacturing process of the wiring board 10 can be modified in various forms without limiting to the above described embodiments. Also, other features of the above embodiments should not be construed as limiting the present invention, and the above embodiments may be modified as appropriate, so long as a modified embodiment yields the actions and effects of the present invention.

DESCRIPTION OF REFERENCE NUMERALS

10: wiring board
11: core material
11a: housing portion
12: first buildup layer
13: second buildup layer
14, 15, 17, 18: resin insulating layer
16, 19: solder resist layer
20: resin filler
21: through hole conductor
22: plugging body
31, 41: conductor layer
30, 32, 40, 42: via conductor
33: terminal pad
34: solder bump
43: BGA pad
44: solder ball
50: capacitor
51: upper surface electrode layer
52: lower surface electrode layer 53: ceramic dielectric layer
60, 61: internal electrode layer
70, 71: via conductor
80, 81, 82, 83: terminal electrode
91: inner circumferential sides of a core material (housing portion)
92: outer circumferential sides of a capacitor
100: semiconductor chip
101: pad
G: gap
P1, P2: chamfered portion

The invention claimed is:

1. A component-built-in wiring board comprising:
    a core material having a housing portion extending through upper and lower surfaces of the core material;
    a component accommodated in the housing portion; and
    a laminate portion in which insulating layers and conductor layers are alternately laminated on at least one of the upper and lower surfaces of the core material, wherein
    a gap between an inner circumferential portion of the housing portion and an outer circumferential portion of the component is filled with a resin filler,
    the inner circumferential portion of the housing portion has a cross-section where a first straight chamfered portion is formed at each corner of a rectangle in a plane direction,
    the outer circumferential portion of the component has a cross-section where a second straight chamfered portion is formed at each corner of a rectangle in the plane direction,
    at least the second chamfered portion has a chamfer length greater than a width of the gap between the first chamfered portion and the second chamfered portion, and
    the outer circumferential portion of the component has the plane shape where an arc-like rounded portion is formed at each end of a straight portion of the second chamfered portion.

2. The component-built-in wiring board according to claim 1, wherein the first chamfered portion has a chamfer length greater than the width of the gap between the first chamfered portion and the second chamfered portion.

3. The component-built-in wiring board according to claim 1, wherein the chamfer length of the second chamfered portion falls within a range of 0.5 to 2 mm.

4. The component-built-in wiring board according to claim 1, wherein a radius of curvature of the rounded portion is lower than or equal to the chamfer length of the second chamfered portion.

5. The component-built-in wiring board according to claim 1, wherein a straight portion of the first chamfered portion and the straight portion of the second chamfered portion are straight lines each of which forms an angle of about 45 degrees with neighboring sides of the respective rectangles.

6. The component-built-in wiring board according to claim 1, wherein the component is a capacitor.

7. The component-built-in wiring board according to claim 6, wherein the capacitor is a multilayer ceramic capacitor in which ceramic dielectric layers and internal electrode layers are alternately laminated, and a plurality of via conductors connected to the internal electrode layers are arranged in a form of lattice or a hound's-tooth check.

* * * * *